US008045337B2

(12) United States Patent
Morales et al.

(10) Patent No.: US 8,045,337 B2
(45) Date of Patent: Oct. 25, 2011

(54) LOCK FOR A HOUSING

(75) Inventors: Jesus R. Morales, Chihuahua (MX); Juan I. Banzo, Chihuahua (MX)

(73) Assignee: Delphi Technologies, Inc., Troy, MI (US)

( * ) Notice: Subject to any disclaimer, the term of this patent is extended or adjusted under 35 U.S.C. 154(b) by 874 days.

(21) Appl. No.: 12/080,517

(22) Filed: Apr. 3, 2008

(65) Prior Publication Data

US 2009/0251850 A1 Oct. 8, 2009

(51) Int. Cl.
*H05K 7/14* (2006.01)
*H05K 7/18* (2006.01)

(52) U.S. Cl. .......................... 361/801; 361/800; 361/803

(58) Field of Classification Search .................. 361/730, 361/752, 796, 728, 797, 800–803; 439/79, 439/389, 391, 395, 404, 417, 449, 460, 461, 439/586, 595, 709, 744; 312/223.1, 223.2
See application file for complete search history.

(56) References Cited

U.S. PATENT DOCUMENTS

| | | | | |
|---|---|---|---|---|
| 4,212,415 | A | 7/1980 | Neely | |
| 4,538,873 | A | 9/1985 | Worth | |
| 4,635,809 | A | 1/1987 | Bachman et al. | |
| 4,728,914 | A | 3/1988 | Morris et al. | |
| 4,759,466 | A * | 7/1988 | Chase et al. | 220/4.02 |
| 4,840,286 | A | 6/1989 | Heberling et al. | |
| 4,951,716 | A | 8/1990 | Tsunoda et al. | |
| 5,383,098 | A * | 1/1995 | Ma et al. | 361/818 |
| 5,657,893 | A * | 8/1997 | Hitchings | 220/326 |
| 6,126,123 | A | 10/2000 | Yang | |
| 6,948,950 | B2 * | 9/2005 | Yamaguchi | 439/76.2 |
| 6,967,286 | B2 | 11/2005 | Daito | |
| 2005/0145410 | A1 | 7/2005 | Daito | |

FOREIGN PATENT DOCUMENTS

| | | |
|---|---|---|
| JP | 6-86426 | 3/1994 |
| JP | 2000-253533 | 9/2000 |

* cited by examiner

*Primary Examiner* — Hung S Bui
(74) *Attorney, Agent, or Firm* — Thomas N. Twomey

(57) ABSTRACT

A lock for a housing may have a protrusion, an opening, a receptacle, and a ramp. The protrusion is formed in a first side wall of a first member of the housing, and the opening is defined in the first side wall. The receptacle extends from a second side wall of a second member of the housing, and is in some ways complementary in shape and in dimensions to the protrusion. The ramp is formed in the second side wall. When the first member and the second member are assembled, the protrusion and the receptacle are mated to form a water-tight seal therebetween, while the ramp is received within the opening.

20 Claims, 3 Drawing Sheets

LOCK FOR A HOUSING

FIELD OF THE INVENTION

This invention relates generally to housings, and more particularly to locks used on electrical housings.

BACKGROUND OF THE INVENTION

Housings are commonly used in bussed electrical centers (BECs) of an automobile. BECs package and centralize power distribution and electronic functions of the automobile. BECs typically include various members that are stacked in a sandwich-like arrangement between its housing. In some cases, the housing is not locked, or otherwise held together, properly; and in other cases, the housing is not adequately sealed against environmental contaminants such as water.

SUMMARY OF THE INVENTION

One embodiment of the invention includes a lock for a housing, the lock may include a protrusion, an opening, a receptacle, and a ramp. The protrusion is formed in a first side wall of a first member of the housing. The opening is defined in the first side wall and is spaced from the protrusion. The receptacle is shaped and dimensioned complementary in some ways to the protrusion and extends away from a second edge of a second side wall of a second member of the housing. The ramp is formed in the second side wall and is spaced away from the receptacle. When the first member and the second member are assembled, the protrusion and the receptacle mate together to form a water-tight seal between them, while the ramp is received within the opening.

Another embodiment of the invention includes a housing that can be used in a bussed electrical center (BEC), the housing may include a first member and a second member. The first member has a first side wall with a first edge. The first member has a protrusion that is formed in the first side wall, and the first member has an opening that is defined in the first side wall and that is spaced from the first edge. The second member has a second side wall with a second edge. The second member has a receptacle that is shaped complementary in some ways to the protrusion and that extends beyond the second edge. The second member also has a ramp that is spaced from the receptacle. When the first member and the second member are assembled and when the protrusion and the receptacle are mated, the first and second member are telescoped together such that the first side wall and the second side wall overlap with respect to each other thus forming a first water-tight seal at an interface of the overlap, and forming a second water-tight seal at an interface of the protrusion and the receptacle.

Another embodiment of the invention includes a housing that can be used in a bussed electrical center (BEC), the housing may include an upper housing, or member, and a lower housing, or member. The upper housing has a first side wall with an inner surface and a first edge. The upper housing has a number of protrusions that are located on the inner surface, and has one opening that is defined in and completely bounded by the first side wall adjacent each of the number of protrusions. The lower housing has a second side wall with an outer surface and a second edge. The lower housing has a receptacle that is complementary in shape and dimensions to one of the number of protrusions and that extends from the outer surface and beyond the second edge. One receptacle is provided for each of the number of protrusions. The lower housing has one ramp spaced from each of the receptacles. And the lower housing has a stop that is formed on the second side wall and that is spaced from each ramp such that each of the ramps is located between the stop and the receptacles. When the upper housing and the lower housing are assembled and each protrusion is mated with each respective receptacle, the upper and lower housings are telescoped together such that the first side wall and the second side wall overlap with respect to each other thus forming a first water-tight seal at the contiguous inner and outer surfaces and a second water-tight seal at an interface between the mating protrusion and receptacle. Each ramp is received within each respective opening, and the stop abuts or otherwise contacts the first edge thus preventing the upper and lower housings from being further assembled or telescoped.

DETAILED DESCRIPTION OF THE PREFERRED EMBODIMENTS

Figure 1:
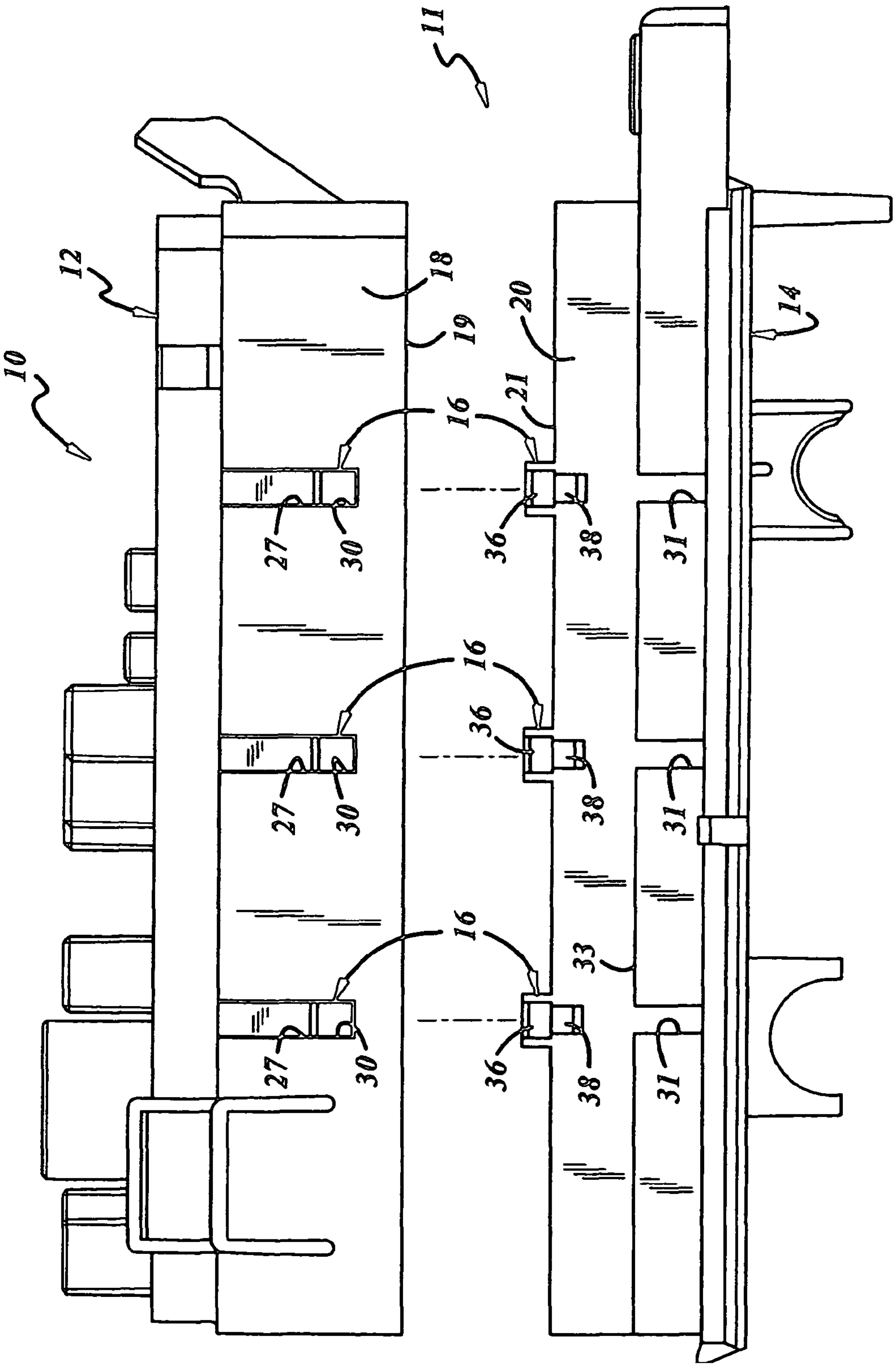
FIG. 1 is an exploded view of a housing having an upper housing and a lower housing, showing several locks in an unlocked state.

Referring in more detail to the drawings, FIGS. 1-5 show a housing 11 of a bussed electrical center (BEC) 10 for an automobile that may include an upper member or housing 12 and a lower member or housing 14. When assembled and brought together, the upper and lower housings 12, 14 are secured to each other by a plurality of locks 16 that are located around the housings. The locks 16 are designed so that, among other things, upon latching, several adequate water-tight seals are produced between the upper and lower housings 12, 14 while minimizing the initial alignment and subsequent assembly distance between the housings with respect to one another. As used here, the term "water-tight" describes a seal whereby water and similar liquids cannot enter or escape past the seal. Though shown and described in use with the BEC 10, the locks 16 can be used on other housings such as those for other electrical assemblies, and even nonelectrical assemblies.

The BEC 10 is the packaged and centralized power-distribution and electronic-functionality center of the associated automobile. Skilled artisans will know that the BEC 10 has various members other than the housing 11 including a cover, a splash shield, circuit boards (all not shown), and the like. Referring to FIG. 1, the upper and lower housings 12, 14 can be assembled together in order to shelter and support one or more circuit boards therein. In one example, each of the upper and lower housings 12, 14 is composed of a one-piece plastic structure that is injection molded; other materials and manufacturing processes are possible. And each of the upper and lower housings 12, 14 are rectangular in shape with four side walls. For example, the upper housing 12 has a first side wall 18, and the lower housing 14 has a second side wall 20. In the case of plastic, both side walls can be somewhat bendable.

The first side wall 18 has a first edge 19 and an inner surface 22, and the second side wall 20 has a second edge 21 and an outer surface 24.

The locks 16 can couple in order to secure the upper and lower housings 12, 14 together while producing several water-tight seals between the housings. Before and during assembly, the locks 16 minimize the distance required between the upper and lower housings 12, 14 just before the housings are brought together, and minimize the distance required to bring the housings together and lock them. Referring to FIG. 1, three locks 16 can be equipped on the first and second side walls 18, 20 of the upper and lower housings 12, 14; the other side walls of the upper and lower housings 12, 14 that are not shown can also have one or more locks 16. Of course, more or less locks can be used on an example housing; indeed, the exact number of locks provided may depend on various factors including the size of the housing and the desired securing force between the upper and lower housing. In embodiments not shown, the locks 16 can be equipped on other members of the BEC 10 that are secured together such as the top cover and the splash shield. Shown best in FIGS. 2 and 3, each lock 16 may be made up of several opposing and, in some ways, complementary parts. In some embodiments, the parts can be unitary with the first and second side walls 18, 20, and in other embodiments, the parts can be separately manufactured and subsequently attached to the first and second side walls. The lock 16 and the upper housing 12 may include a protrusion 26, a slot 27, and an opening 30; and the lock 16 and the lower housing 14 may include a projection 28, a groove 31, and a stop 33. The different parts of the upper housing 12 and the lower housing 14 are positioned and oriented complementary to each other such that they can, as the case may be, mate, nest, receive, and abut each other when the housings are assembled.

The protrusion 26 is formed in the first side wall 18, and is constructed to mate in part with the projection 28 and thus couple the upper and lower housings 12, 14 together. In one sense, the protrusion 26 constitutes the male member of the lock 16. The protrusion 26 is partly formed on the inner surface 22. The protrusion 26 can be an elongated bulge as compared to the immediately surrounding inner surface 22. At one end, the exterior surface of the protrusion 26 may form a recess 34. The protrusion 26 has a first outer side surface 32 and an opposite second outer side surface 35. The recess 34 is spaced from the opening 30 such that the opening is located between the recess and the first edge 19. The recess 34 is contoured in the structure of the first side wall 18 in a shape to match a mating part of the projection 28. As shown best in FIGS. 3 and 5, the recess 34 can have a somewhat arch or arcuate shape, or as not shown, could have a tapered shape, a linear shape with two slanted lines, or another shape that complements the mating part of the projection 28.

Figure 2:
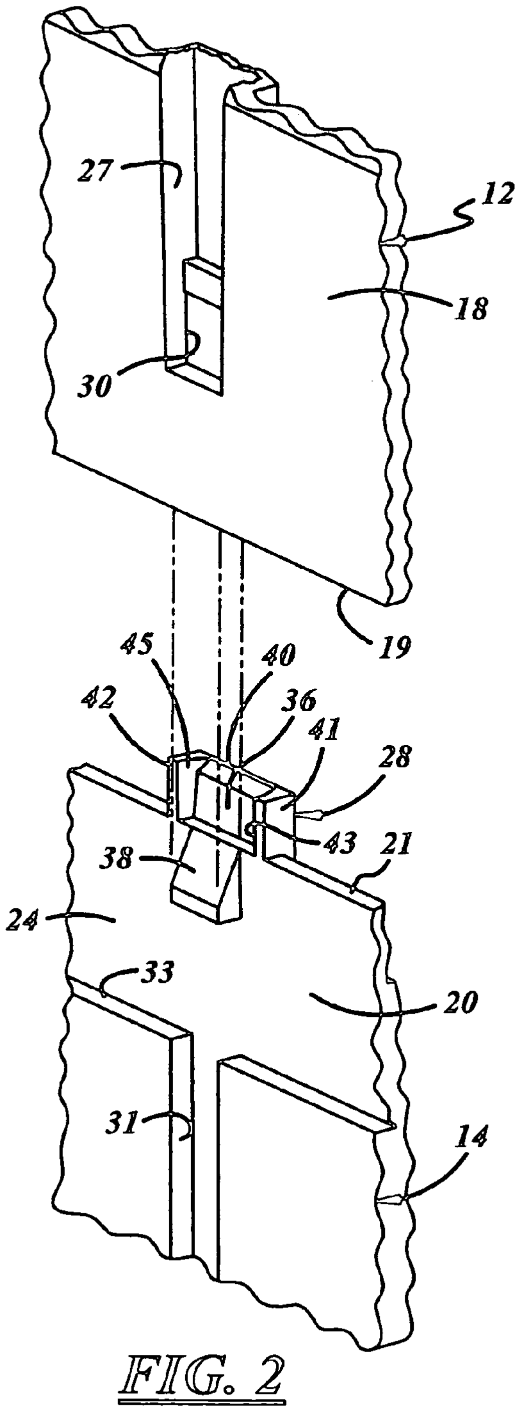
FIG. 2 is a fragmentary front perspective view of a lock that can be used on the housing of FIG. 1, shown in an unlocked state.

The slot 27 is formed in the first side wall 18 and can be an elongated depression or indentation as compared to the immediately surrounding surface of the first side wall. As shown in FIG. 2, the slot 27 extends from the opening 30 and can continue to a top wall of the upper housing 12.

The opening 30 is defined in the first side wall 18, and is cut completely through and bounded completely by the first side wall. The opening 30 can have a shape that in some ways matches that of a complementary part of the projection 28, in this case a rectangle. The opening 30 is spaced from the first edge 19 of the first side wall 18.

The projection 28 extends from the second side wall 20 of the lower housing 14, and mates with the protrusion 26 and the opening 30. In one sense, the projection 28 constitutes the female member of the lock 16. The projection 28 is constructed partly on the outer surface 24 and partly extends beyond the second edge 21. As alluded to, the projection 28 may be constructed to correspond to the protrusion 26 and the opening 30 so that they can mate and couple together. As shown in FIG. 2, the projection 28 has a receptacle 36 and a ramp 38. The receptacle 36 extends beyond the second edge 21 of the second side wall 20 and is a "receptacle" in the sense that it receives a part of the protrusion 26. The receptacle 36 has a free or terminal end 40 and a middle section that are in some ways shaped and dimensioned complementary to the recess 34. In this case, the free end 40 and middle section have a somewhat arch or arcuate shape. The receptacle 36 has a first outer wall 41 and a second outer wall 42 that border the free end 40 and the middle section. The first outer wall 41 has a first inner surface 43, and the second outer wall 42 has a second inner surface 45.

The ramp 38 extends outwardly with respect to the outer surface 24, and is tapered or sloped in the direction of the receptacle 36. The ramp 38 is spaced from the receptacle 36 and extends at one end from the second edge 21, and at another end to its peak that is spaced from the second edge. The ramp 38 is dimensioned to fit and snap within the opening 30. The groove 31 is defined or cut in the second side wall 20 and extends to, or otherwise interrupts, the stop 33. The groove 31 is aligned vertically—as viewed in FIG. 2—with the ramp 38 to provide access for a tool, such as a screwdriver. This way, the screwdriver can be wedged between the first and second side walls 18, 20 and pry, or otherwise deflect, the side walls away from each other to thus unmate the protrusion 26 and the receptacle 36. When unmated, the upper and lower housings 12, 14 can be disassembled. The ledge or stop 33 is spaced from the receptacle 36 such that the ramp 38 is located between the stop and the receptacle. In one embodiment, the stop 33 is an elongated planar surface, or step, that extends perpendicularly away from the outer surface 24, and that extends parallel to the second edge 21. In other embodiments, the stop 33 can be an outward projection that does not necessarily run substantially continuously along the second side wall 20 as shown.

Figure 3:
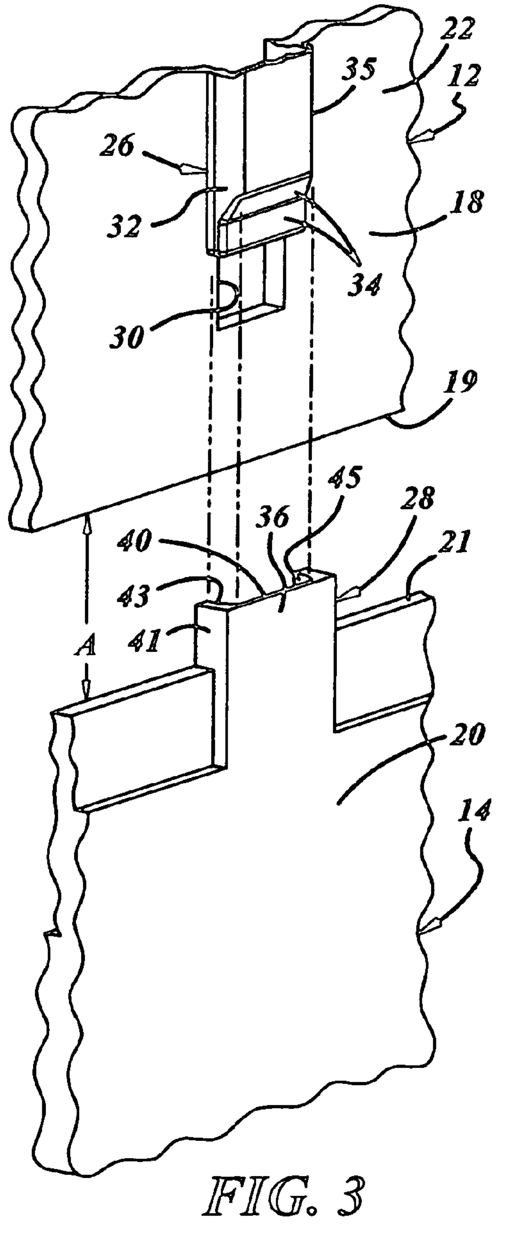
FIG. 3 is a fragmentary rear perspective view of the lock of FIG. 2.
Figure 4:
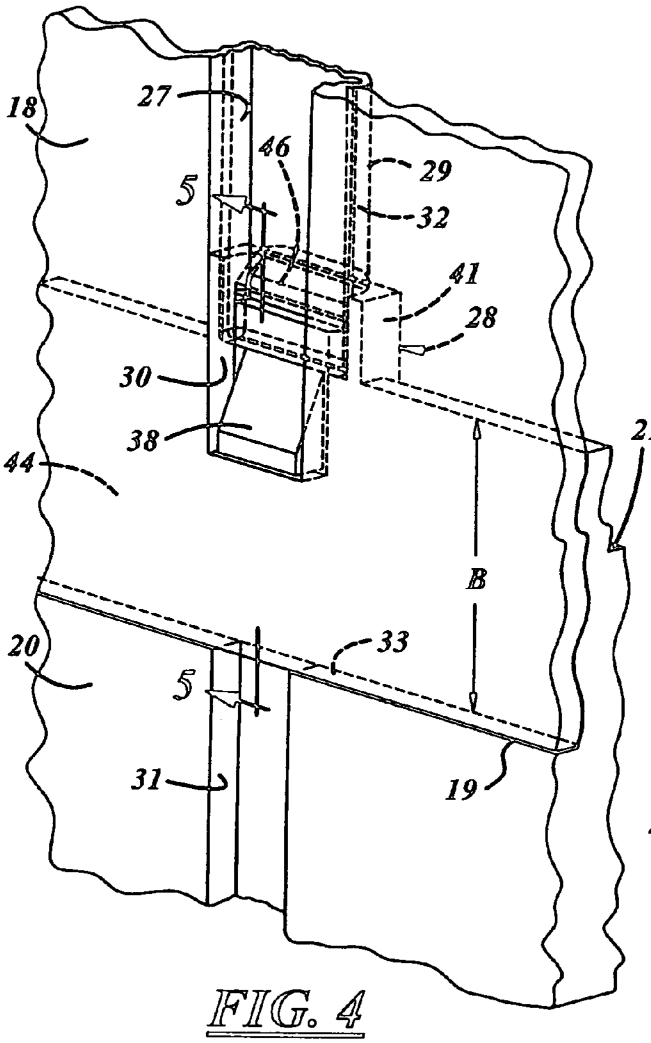
FIG. 4 is a fragmentary view of the lock of FIG. 2 shown in a locked state, with the hidden sections shown in phantom.

When the upper housing 12 and the lower housing 14 are assembled, the lock 16 secures the housings together and forms numerous water-tight seals in the assembly. Referring to FIG. 3, the upper and lower housings 12, 14 are initially aligned and prepared for assembly whereby a distance A measured between the first edge 19 and the second edge 21 is minimal for proper assembly—in this case about 4.2 millimeters. This is partly because of the receptacle 36 that is positioned adjacent the first edge 19 and need only extend a minimal distance from the second edge 21 while still providing an adequate seal. Here, the free end 40 is close to, but has not yet breached the first edge 19. The lower housing 14 is then telescoped inside of, or otherwise inserted into, the upper housing 12. In this way, the protrusion 26 and the receptacle 36 are mated internally. As insertion proceeds, the first edge 19 engages the ramp 38 and slides over the ramp, thus deflecting the first side wall 18. The housings slide together until the first edge 19 engages, or abuts against, the stop 33, and the receptacle 36 is nested partly with the protrusion 26 and with the recess 34. When nested, the receptacle 36 seats with and bears against the opposing surfaces of the protrusion 26 and the recess 34. The ramp 38 is received or snaps within the opening 30, and prevents the upper housing and the lower housing 12, 14 from becoming unsecured, or otherwise being pulled apart. Also, the first outer side surface 32 bears against the first inner surface 43, and the second outer side surface 35 bears against the second inner surface 45. When completely assembled, the upper and lower housing 12, 14 overlap with respect to each other a distance B (FIG. 4) measured between the first edge 19 and the second edge 21—in this case about 13.8 millimeters. In some cases, this distance may be the minimal distance required while still providing an adequate seal at the overlap.

Figure 5:
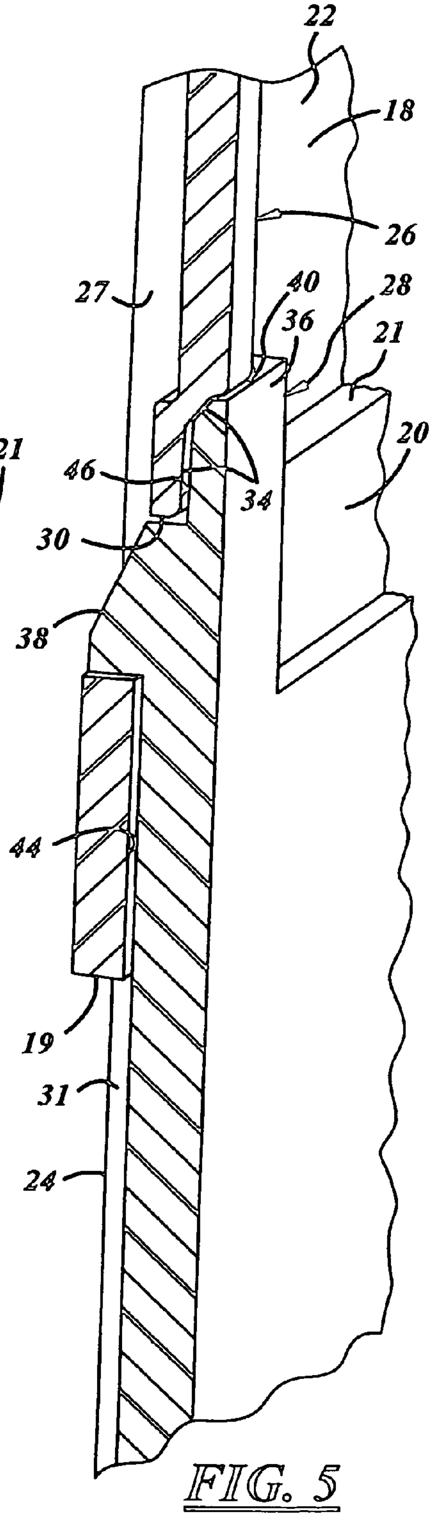
FIG. 5 is a sectional view taken along line 5-5 in FIG. 4.

Referring to FIG. 5, numerous water-tight seals are produced between the upper and lower housings 12, 14 and between the protrusion 26 and the receptacle 36. For example, a first water-tight seal 44 is formed at the overlap of the contiguous inner and outer surfaces 22 and 24, and a second water-tight seal 46 is formed at an interface of the contiguous surfaces of the protrusion 26 and the receptacle 36.

Though described as having particular parts, not all of the parts need be provided in the lock 16. For example, the slot 27 of the first side wall 18 and the groove 31 of the second side wall 20 may be omitted while not necessarily degrading the integrity of the lock 16. As another example, the shapes and dimensions of the parts may differ according to, among other things, manufacturing techniques and tolerances, and the size of the housing 11.

It will be readily understood by those persons skilled in the art that the present invention is susceptible of broad utility and application. Many embodiments and adaptations of the present invention other than those described above, as well as many variations, modifications and equivalent arrangements, will be apparent from or reasonably suggested by the present invention and the foregoing description, without departing from the substance or scope of the present invention. Accordingly, while the present invention has been described herein in detail in relation to its preferred embodiment, it is to be understood that this disclosure is only illustrative and exemplary of the present invention and is made merely for purposes of providing a full and enabling disclosure of the invention. The foregoing disclosure is not intended or to be construed to limit the present invention or otherwise to exclude any such other embodiments, adaptations, variations, modifications and equivalent arrangements, the present invention being limited only by the following claims and the equivalents thereof.

What is claimed is:

1. A lock for a housing, comprising:

a protrusion formed in a first side wall of a first member of the housing, wherein the protrusion defines a slot indented into the first sidewall;

an opening defined in the first side wall and being spaced from the protrusion;

a receptacle shaped complementary to the protrusion and extending away from a second edge of a second side wall of a second member of the housing; and a ramp formed in the second side wall and being spaced away from the receptacle;

wherein, when the first member and the second member are assembled, the protrusion and the receptacle are mated to form a water-tight seal therebetween, and the ramp is received within the opening.

2. The lock of claim 1 wherein the protrusion forms a recess that is formed on an inner surface of the first side wall, and the ramp extends from an outer surface of the second side wall.

3. The lock of claim 1 wherein the opening is spaced from a first edge of the first side wall and is located between the first edge and the protrusion.

4. The lock of claim 1 wherein the slot is adjacent the opening and spaced away from a first edge of the first side wall, the slot forming the protrusion on a side opposite the slot of the first side wall.

5. The lock of claim 1 wherein the protrusion has a first outer side surface and a second outer side surface, the receptacle has a first outer wall bordering one side and a second outer wall bordering an opposite side, the first outer wall having a first inner surface and the second outer wall having a second inner surface, and wherein, when the protrusion and the receptacle are mated, the first outer side surface bears against the first inner surface and the second outer side surface bears against the second inner surface.

6. The lock of claim 1 wherein a stop is formed in the second side wall, the stop being spaced from the ramp such that the ramp is located between the stop and the receptacle, the stop abutting against the first side wall when the protrusion and the receptacle are mated, preventing the first and second members from being further assembled.

7. The lock of claim 1 wherein a groove is defined in the second side wall that, when the first member and the second member are assembled, provides access for a tool to wedge between the first side wall and the second side wall in order to disengage the ramp and the opening, and in order to disassemble the first member and the second member.

8. A housing for a bussed electrical center (BEC), comprising:

a first member having a first side wall with a first edge, and having a protrusion formed in the first side wall wherein the protrusion defines a slot indented into the first sidewall, the first member having an opening defined in the first side wall and spaced from the first edge; and a second member having a second side wall with a second edge, and having a receptacle shaped complementary to the protrusion and extending beyond the second edge, the second member having a ramp spaced from the receptacle;

wherein, when the first member and the second member are assembled and when the protrusion and the receptacle are mated, the first and second member are telescoped together such that the first side wall and the second side wall overlap with respect to each other to form a first water-tight seal at an interface of the overlap, and a second water-tight seal is formed at an interface of the protrusion and the receptacle.

9. The housing of claim 8 wherein the first member is an upper housing, and the second member is a lower housing.

10. The housing of claim 8 wherein the protrusion is located on an inner surface of the first side wall, the ramp is located on an outer surface of the second side wall, and the second member telescopes inside of the first member when the first member and the second member are assembled and when the protrusion and the receptacle are mated, and the first water-tight seal is formed between the contiguous inner surface and outer surface.

11. The housing of claim 8 wherein the receptacle is shaped complementary to the protrusion, and wherein the ramp is received within the opening when the first member and the second member are assembled and when the protrusion and the receptacle are mated.

12. The housing of claim 8 wherein the slot is adjacent the opening and spaced away from the first edge, the slot forming the protrusion on a side opposite the slot of the first side wall.

13. The housing of claim 8 wherein the protrusion has a first outer side surface and a second outer side surface, the receptacle has a first outer wall bordering one side and a second outer wall bordering an opposite side, the first outer wall having a first inner surface and the second outer wall having a second inner surface, and wherein, when the first member and the second member are assembled and when the protrusion and the receptacle are mated, the first outer side surface bears against the first inner surface and the second outer side surface bears against the second inner surface.

14. The housing of claim 8 wherein the second member has a stop formed in the second side wall, the stop being spaced from the ramp such that the ramp is located between the stop and the receptacle, the stop abutting against the first edge when the first member and the second member are assembled and when the protrusion and the receptacle are mated, thus preventing the first and second members from being further assembled.

15. The housing of claim 14 wherein the stop is a ledge extending across the second side wall and being parallel to the second edge.

16. The housing of claim 8 wherein, when the first member and the second member are assembled, the first side wall and the second side wall overlap with respect to each other a total distance measured between the first edge and the second edge of about 13.8 millimeters.

17. The housing of claim 8 wherein the second member has a groove defined in the second side wall that, when the first member and the second member are assembled and when the protrusion and the receptacle are mated, provides access for a tool to wedge between the first side wall and second side wall in order to disassemble the first member and the second member.

18. A housing for a bussed electrical center (BEC), comprising:

an upper housing having a first side wall with an inner surface and a first edge, the upper housing having a plurality of protrusions located on the inner surface wherein each protrusion defines a slot indented into the first sidewall, and having an opening defined in and completely bounded by the first side wall adjacent each of the plurality of protrusions; and a lower housing having a second side wall with an outer surface and a second edge, the lower housing having a receptacle extending from the second edge for each of the plurality of protrusions, the lower housing having a ramp extending from the outer surface and spaced from each of the receptacles, and the lower housing having a stop formed on the second side wall and spaced from each ramp such that each ramp is located between the stop and the receptacles;

wherein, when the upper housing and the lower housing are assembled and each protrusion is mated with each respective receptacle, the upper and lower housings are telescoped together such that the first side wall and the second side wall overlap with respect to each other to form a first water-tight seal at the contiguous inner and outer surfaces, each protrusion is nested within the respective receptacle to form a second water-tight seal at an interface between the protrusion and the receptacle, each ramp is received within the respective opening, and the stop abuts against the first edge preventing the upper and lower housings from being further assembled.

19. The housing of claim 18 wherein the slot is adjacent each opening and spaced away from the first edge, the slot forming each protrusion on a side opposite the slot of the first side wall.

20. The housing of claim 19 wherein the protrusion has a first outer side surface and a second outer side surface, the receptacle has a first outer wall bordering one side and a second outer wall bordering an opposite side, the first outer wall having a first inner surface and the second outer wall having a second inner surface, and wherein, when the first member and the second member are assembled and when the protrusion and the receptacle are mated, the first outer side surface bears against the first inner surface and the second outer side surface bears against the second inner surface.

* * * * *